United States Patent
Braun et al.

(10) Patent No.: US 7,154,773 B2
(45) Date of Patent: Dec. 26, 2006

(54) MRAM CELL WITH DOMAIN WALL SWITCHING AND FIELD SELECT

(75) Inventors: Daniel Braun, Paris (FR); Gerhard Mueller, Munich (DE)

(73) Assignee: Infineon Technologies AG, Munich (DE)

(*) Notice: Subject to any disclaimer, the term of this patent is extended or adjusted under 35 U.S.C. 154(b) by 68 days.

(21) Appl. No.: 11/094,473

(22) Filed: Mar. 31, 2005

(65) Prior Publication Data

US 2006/0221674 A1    Oct. 5, 2006

(51) Int. Cl.
*G11C 11/00* (2006.01)

(52) U.S. Cl. ............... 365/158; 365/171; 365/173; 365/225.5; 365/209

(58) Field of Classification Search ............... 365/158, 365/171, 173, 225.5, 209
See application file for complete search history.

(56) References Cited

U.S. PATENT DOCUMENTS 6,704,220 B1 * 3/2004 Leuschner ............... 365/173
6,807,092 B1 * 10/2004 Braun ............... 365/173

* cited by examiner

*Primary Examiner*—Richard Elms
*Assistant Examiner*—Pho M. Luu
(74) *Attorney, Agent, or Firm*—Edell, Shapiro & Finnan, LLC

(57) ABSTRACT

An MRAM cell includes a magnetic tunnel junction including first and second magnetic regions stacked in a parallel, overlying relationship and separated by a non-magnetic tunneling barrier layer. The first magnetic region includes a reference layer having a fixed magnetization adjacent the tunneling barrier layer. The second magnetic region includes a free layer having first and second free magnetizations aligned with an easy axis of magnetization of the free layer. The first and second free magnetizations are oppositely aligned and separated by a magnetic domain wall. The magnetic domain wall is magnetically movable along the easy axis of the free layer, and the free layer is magnetically coupled to magnetic fields generated by first and second currents running through first and second conductive lines crossing each other, wherein the easy axis of the free layer is inclined under an inclination angle relative to both the first and second conductive lines.

7 Claims, 4 Drawing Sheets

MRAM CELL WITH DOMAIN WALL SWITCHING AND FIELD SELECT

FIELD OF THE INVENTION

The present invention pertains to non-volatile semiconductor memory chips and more particularly to magnetoresistive random access memory cells with domain wall switching for use in a semiconductor integrated circuit.

BACKGROUND

MRAM technology is a non-volatile random access memory technology that may replace present random access memories as the standard memory technology for computing devices. An MRAM cell (also referred to as tunneling magnetoresistive or TMR-device) includes a structure having ferromagnetic layers separated by a non-magnetic layer and being arranged into a magnetic tunnel junction (MTJ). In MRAM cells, digital information is not stored by power but rather is represented as directions of magnetic moment vectors (or magnetizations) in the ferromagnetic layers. More specifically, one of the ferromagnetic layers constitutes a reference layer, the magnetization of which is magnetically fixed or pinned, while the other one of the ferromagnetic layers constitutes a free or storage layer, the magnetization of which is free to be switched between two preferred directions along a preferred magnetization axis (easy axis of magnetization). The free layer magnetization easy axis typically is aligned with the fixed magnetization of the reference layer. In the MTJ's practical use as memory element, one bit of logic information can be assigned to the two different orientations of the free layer magnetization.

Depending upon the two different magnetic states of the free layer (i.e., different directions of magnetization along the easy axis), the MTJ exhibits two different resistance values in response to a voltage applied across the magnetic tunneling junction barrier. Accordingly, the particular resistance of the MTJ reflects the magnetization state of the free layer, such that the electrical resistance is lower when the magnetization of the free layer is parallel to the fixed magnetization of the reference layer than when the free layer magnetization is anti-parallel to the fixed magnetization of the reference layer. Hence, a detection of electric resistance permits "reading" of a particular orientation of the free layer magnetization relative to the fixed magnetization and thus provides the logic information assigned thereto.

In order to switch MRAM cells, magnetic fields which are coupled to the switchable magnetization of the magnetic free layer are applied, which typically are generated by supplying currents to conductive lines, e.g., bit and word lines, that typically cross at right angles with an MRAM cell conventionally being positioned in an intermediate position therebetween and at an intersection thereof (also referred to as "crosspoint-architecture" of MRAM cells).

To be useful in present day electronic devices, MRAM cells need to be arranged in very high-density memory cell arrays. Accordingly, a further down-scaling of individual MRAM cells is seen to be essential to bring MRAM cells into practical use. However, in down-scaling MRAM cells, a number of problems arise that need to be solved. In fact, smaller MRAM cells require higher and higher magnetic switching fields, since, for a given aspect ratio and given free layer thickness, the magnetic switching fields increase roughly like $$\frac{1}{\sqrt{w}} \text{ or } \frac{1}{w},$$

depending on the cell concept, where w is the width of the memory cell. Hence, field selected switching becomes ever more difficult where the width w of the memory cell is decreased and, therefore, large switching currents must be used.

In order to overcome the problem of increased switching currents in smaller MRAM cells, a new concept of MRAM cells featuring domain wall switching has been proposed by the current inventor: see U.S. Pat. No. 6,807,092 B1 to Braun, the disclosure of which is incorporated herein by reference in its entirety.

Reference is now made to FIG. 1, which depicts the basic structure of the new memory cell with domain wall switching. Accordingly, an MRAM cell includes a magnetic tunnel junction (MTJ) 4 stacked in the z-direction, comprised of a magnetic reference layer 1 and a magnetic free layer 2 that are separated by a non-magnetic intermediate layer 3 made of an insulating material that functions as a tunneling barrier. Magnetization 5 of the reference layer 1 is fixed or pinned in a specified direction which for instance is a positive x-direction as depicted in FIG. 1. Otherwise, the magnetic material of the free layer 2 is (or can be) magnetized along a preferred or easy axis of magnetization, while its magnetization is free to be switched between the two preferred directions of the easy axis. The easy axis of the free layer typically is chosen to be aligned with the fixed or pinned reference layer 1 magnetization 5 thus having an x-direction in FIG. 1.

In the new cell concept, free layer 2 is magnetized to have two magnetization components that are oppositely aligned to each other, namely, a first free magnetization 6 positioned on one side (e.g., the left side as depicted in FIG. 1) of the free layer 2 and magnetized in a first direction towards a central portion of the free layer (e.g., the positive x-direction in FIG. 1), and, a second free magnetization 7 positioned on the other side (e.g., right side as depicted in FIG. 1) of the free layer 2 and magnetized in a second direction towards the central portion of the free layer 2 (e.g., the negative x-direction in FIG. 1), where both "sides" are seen to refer to different sides of the free layer 2 along its easy axis of magnetization. Since the first and second free magnetizations 6, 7 are in opposite alignment to each other, a magnetic domain wall 8 (or boundary layer) is created in between them.

In FIG. 1, magnetic reservoirs 9 are disposed below the free layer 2 of the MTJ 4 along opposing edges of the free layer 2, which may be formed from either a soft magnetic material or a hard magnetic material. Both magnetic reservoirs 9 are permanently magnetized in the same direction resulting in magnetizations 10 that are orthogonal to the free layer 2. In FIG. 1, magnetizations 10 point in a positive z-direction.

The magnetizations 10 of the magnetic reservoirs 9 are magnetically coupled to the magnetic free layer 2 to thereby magnetize the magnetic material of the free layer 2 in regions thereof that are adjacent the magnetic reservoirs 9, and, as a result, above-described first and second free magnetizations 6, 7 of the free layer 2 that are oppositely aligned are created.

Magnetic reservoirs 9 are also called "frustrated" magnetic reservoirs (such as is typical in spin glasses) because of the fact that adjacent reservoirs tend to have an opposite alignment of their magnetizations to reduce the overall magnetic energy.

In FIG. 1, a conductive line 11 is disposed between both magnetic reservoirs 9, the magnetic fields of which are magnetically coupled to the first and second free magnetizations 6, 7 of the free layer 2. Magnetic coupling between magnetic fields of the current line 11 and first and second free magnetizations 6, 7 can result in a shift or sweeping out of the magnetically movable domain wall 8 along the free layer 2 easy axis. In other words, depending on the direction of current I propagating through conductive line 11 (positive or negative y-direction), the domain wall 8 is caused to move towards one of the ends of the free layer 2 (positive or negative x-direction). More specifically, in FIG. 1, when a current propagates in the positive y-direction, domain wall 8 is caused to move in the negative x-direction, and vice versa. Inasmuch the domain wall 8 is caused to move in the positive or negative x-direction, a net magnetic moment is created in the free layer 2, resulting in a magnetization that is either in parallel or anti-parallel alignment relative to the fixed magnetization of the reference layer. Reading of the information can be performed using a conventional method of measuring electric resistance of the MTJ 4.

Accordingly, the memory cell can be written to using a single write current made to flow through current line 11 using a transistor switch (not shown) conductively connected to the current line 11. This method is also called "silicon-select."

Numerical simulations show that the magnetic domain wall between free magnetizations of the free layer is swept out easily from the free layer, when applying small switching currents. The structure thus remains in a stable state ("0" or "1"), depending on whether the boundary layer is swept out to the one or the other side of the free layer along its easy axis. When the current is inverted, switching proceeds by re-creation of the boundary layer and sweeping across the cell towards the other edge. The concept has the advantage of greatly reduced switching currents compared to conventional Stoner-Wohlfahrt switching. For example, in a $40 \times 100 \times 3.75$ nm$^3$ sized memory cell, a 2 mA switching current is sufficient to switch the memory cell and to reach a state that is stable after turning off the current. While small switching currents are possible, the need to arrange a comparatively large switch transistor for the memory cell is seen to be detrimental to a further down-scaling of the memory cell.

SUMMARY

The invention provides a new memory cell with domain wall switching enabling an improved writing method to allow a further cell size down-scaling. According to the invention, a magnetoresistive random access memory (MRAM) cell is provided, which comprises a stacked structure including a magnetic tunnel junction (MTJ). The magnetic tunnel junction comprises first and second magnetic regions made of magnetic material that are stacked in a parallel, overlying relationship and separated by a tunneling barrier layer made of non-magnetic material. The first magnetic region has a fixed or pinned magnetization adjacent the tunneling barrier layer, while the second magnetic region has a magnetic material adjacent the tunneling barrier layer provided with a preferred direction (or easy axis) of magnetization and thus preferably is magnetized in the same and opposite directions with respect to the fixed magnetization which typically is in parallel alignment with the easy axis. Switchability of the free layer magnetization with respect to the reference layer magnetization can be achieved by selecting a free layer material having a lower coercivity than the reference layer material. The preferred axis of magnetization of the free layer typically is due to shape and/or intrinsic anisotropy.

In the memory cell of the invention, the free layer magnetization is comprised of first and second free (switchable) magnetizations both of which are aligned with the easy axis of the free layer and which are oppositely aligned to each other. Opposite alignment of the first and second free magnetizations results in creation of a magnetic domain wall or boundary layer between them. The first and second free magnetizations may be directed towards a center portion of the free layer; alternatively the first and second free magnetizations may be directed towards end portions thereof.

Preferably, the first and second free magnetizations are created by frustrated magnetic reservoirs having magnetizations being aligned in the same direction that are magnetically coupled to the magnetic free layer. Preferably, the frustrated magnetic reservoirs are disposed adjacent the free layer along opposing edges thereof.

The magnetic domain wall (or boundary layer) between the first and second free magnetizations is (magnetically) movable along both directions of the easy axis of the free layer. Accordingly, the magnetic free layer is magnetically coupled to magnetic fields generated by first and second currents running through first and second conductive lines (typically write word and bit lines) crossing each other at a (typically right) crossing angle, with an MTJ typically being positioned at an intersection thereof in an intermediate position therebetween.

In the MRAM cell of the invention, the easy axis of magnetization of the free layer, being in parallel alignment to the fixed magnetization of the reference layer, is inclined under an inclination angle different from zero relative to both of the first and second conductive lines. In other words, the easy axis is not in a parallel alignment as to the first or second conductive lines. In a typical arrangement of first or second conductive lines crossing at right angles, the inclination angle of the easy axis relative to the first conductive line and relative to the second conductive line lies in a range of from more than 0° to below 90°, and is preferably about 45°.

Accordingly, in the MRAM cell of the invention, due to the direction of the free layer easy axis with respect to the first and second conductive lines, both first and second conductive lines respectively have a magnetic field component along the easy axis of the free layer.

Hence, the MRAM cell of the invention circumvents above mentioned problem of providing a large-sized switch transistor for each memory cell by enabling a magnetic field select method to select (or write) a single memory cell in case a vector sum (or superposition) of magnetic field components of the first and second conductive lines arriving at the free layer is above a specified critical value (or threshold value) for switching the memory cell, whereas each one of the magnetic fields alone is under-critical that is to say has a magnetic field below the critical value. Accordingly, a magnetic field select method may be used to switch the memory cells of the invention rendering switch transistors for each one of the memory cells obsolete which allows a further down-scaling of the memory cells.

BRIEF DESCRIPTION OF THE DRAWINGS

Other and further objects, features and advantages of the invention will appear more fully from the following description.

The accompanying drawings, which are incorporated in and constitute a part of the specification, illustrate presently preferred embodiments of the invention, and together with the general description given above and the detailed description given below, serve to explain the principles of the invention.

DETAILED DESCRIPTION

The present invention will be described in detail below with reference to the accompanying drawings, where like designations denote like or similar elements.

Figure 1:
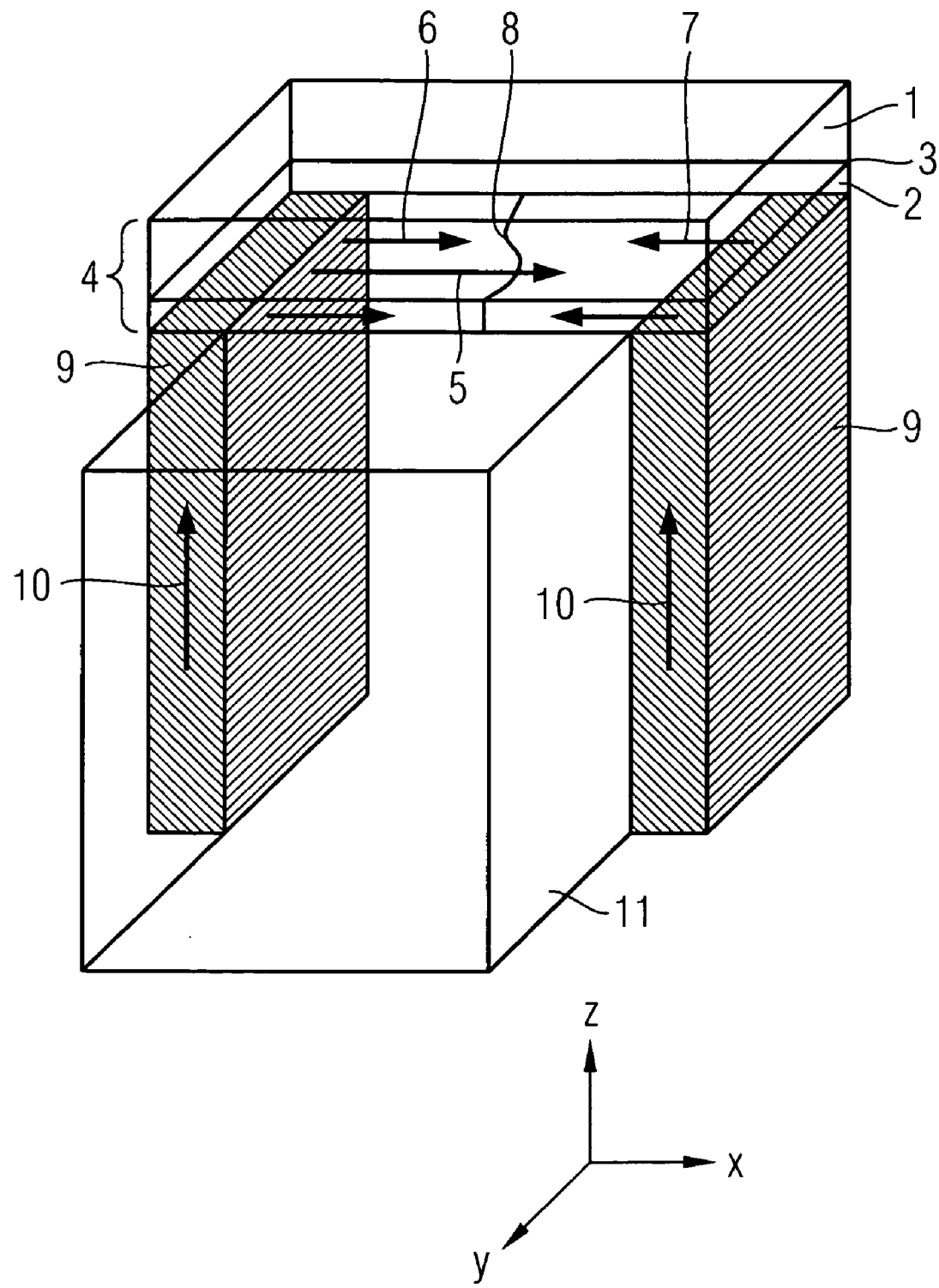
FIG. 1 is a schematic fragmentary view of a conventional MRAM cell having frustrated magnetic reservoirs.
Figure 2:
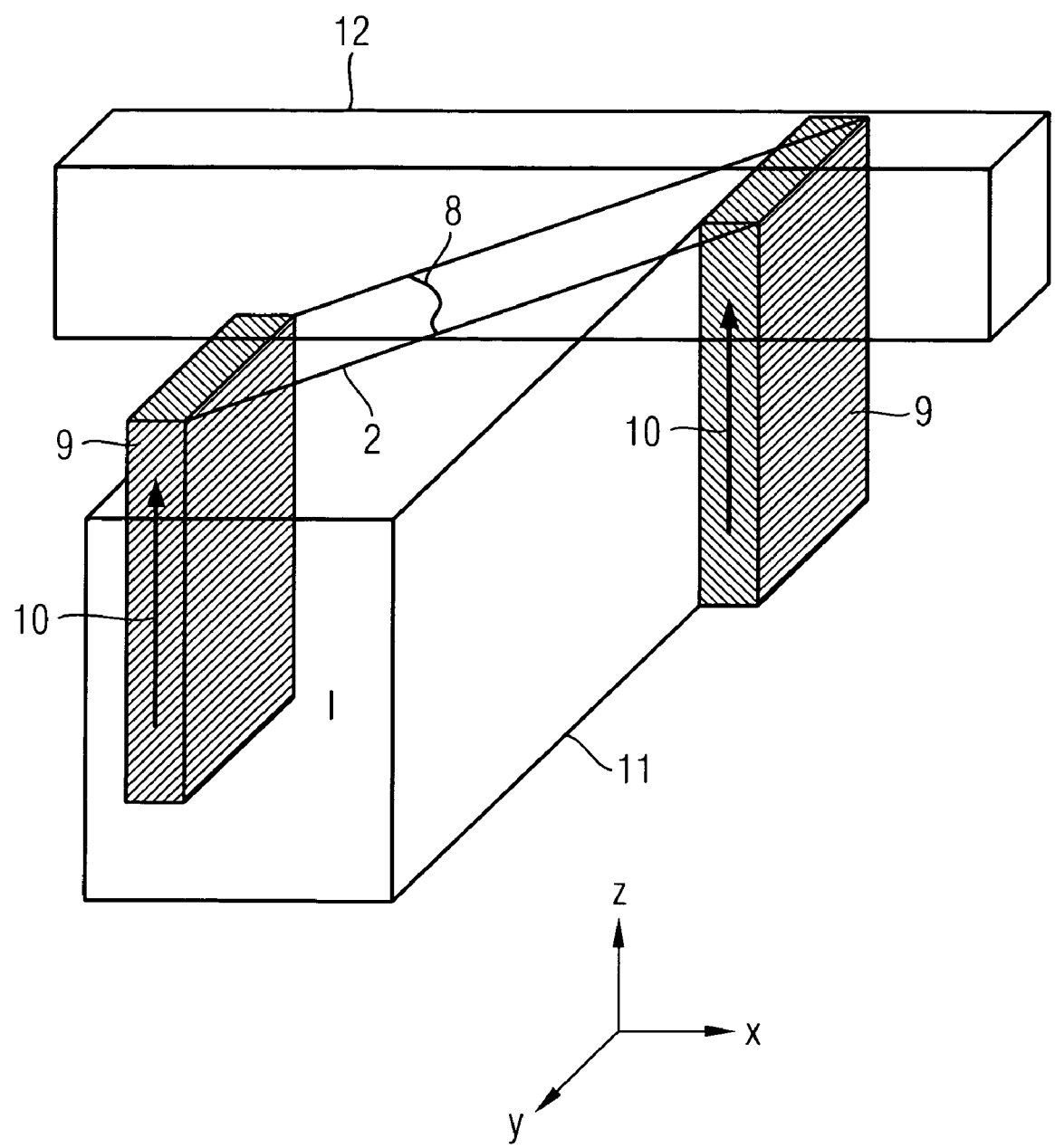
FIG. 2 is a schematic fragmentary perspective view of an embodiment of the MRAM cell of the invention.
Figure 3:
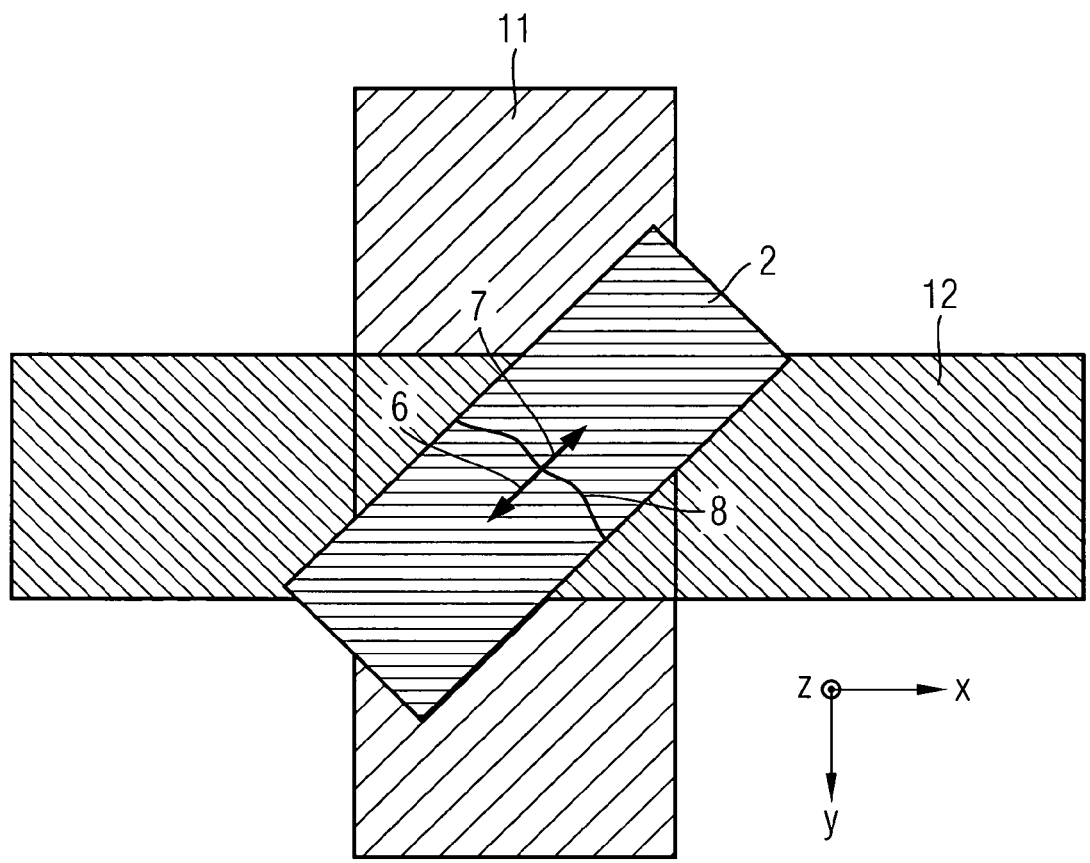
FIG. 3 is a top-down view of the embodiment of the MRAM cell of the invention of FIG. 2.

Now referring to FIGS. 2 and 3, an exemplary embodiment of the memory cell of the invention is explained. More particularly, FIG. 2 shows a schematic fragmentary perspective view of an embodiment of the MRAM cell of the invention and FIG. 3 is a top plan view thereof.

Accordingly, an MRAM cell includes a magnetic tunnel junction (MTJ) stacked in the z-direction, comprised of a magnetic reference layer and a magnetic free layer 2 below the reference layer that are separated by an intermediate tunneling layer 3. In FIGS. 2 and 3, for the purpose of simplified illustration only, solely the free layer 2 of MTJ is shown. It will be understood that each of the reference and free layers may be formed of a plurality of sublayers.

The reference layer has a fixed or pinned magnetization (for instance by using a pinning layer not shown in FIG. 2). The free layer 2 is provided with a preferred axis (or easy axis) of magnetization that may be due to shape and/or intrinsic anisotropy. Accordingly, the free layer 2 magnetic material may be preferably magnetized in both directions along its magnetization easy axis. The pinning layer fixed magnetization is in parallel alignment with the free layer easy axis of magnetization.

Further, a first conductive line 11 parallel to the y-direction and a second conductive line 12 parallel to the x-direction are disposed below and above the MTJ, respectively, crossing at a right angle, while the MTJ is positioned at an intersection thereof.

Frustrated magnetic reservoirs 9 are disposed below the free layer 2 along opposing edges thereof in direct contact therewith and are arranged on opposing sides of the first conductive line sandwiching the first conductive line in between. As is typical, magnetic reservoirs are made from either a soft magnetic material or a hard magnetic material. Both magnetic reservoirs 9 are permanently magnetized in the same direction (e.g., the positive z-direction as depicted in FIG. 2) to have magnetizations 10 that are substantially orthogonal to the free layer 2. The magnetizations 10 of the magnetic reservoirs 9 are magnetically coupled to the free layer 2 to thereby cause magnetization of the magnetic material of the free layer 2 in regions that are adjacent the magnetic reservoirs 9. As a result, first and second magnetizations 6, 7 of the free layer 2 oppositely aligned and respectively directed towards a center portion of the free layer 2 are created. It is to be understood, that permanent magnetizations 10 of the magnetic reservoirs 9 that are directed in negative z-direction will result in first and second magnetizations 6, 7 that are oppositely aligned and are directed from a central portion of the free layer 2 towards end portions thereof.

In between first and second free magnetizations 6, 7 of the free layer 2, magnetic domain wall 8 (or boundary layer) is created that is magnetically movable dependent on magnetic fields coupled therewith. Coupling magnetic fields from the conductive lines to the free layer 2 magnetizations may result in a sweeping out of the boundary layer of the free layer, while inverting the currents of the conductive lines, may re-create the boundary layer and cause sweeping out of it towards the other edge. More specifically, in FIG. 2, if electric current through conductive line 11 is propagating in positive y-direction and, simultaneously, electric current through conductive line 12 is propagating in negative x-direction, the domain wall 8 is caused to move towards a left end portion of the free layer 2, and vice versa.

Hence, the MRAM cell of the invention enables magnetic field select by facilitating selection (or writing) of single memory cells where the vector sum of magnetic fields of both conductive lines 11, 12 arriving at the free layer are over-critical, that is to say is above a critical threshold value for switching the free layer magnetization (or sweeping out or moving the boundary towards one end portion of the free layer), while otherwise no selection (or writing) occurs in case the vector sum of both magnetic fields of conductive lines 11, 12 is under-critical that is to say is below the critical threshold value for switching the free layer magnetization. The latter case typically is realized if magnetic field of only one of the conductive lines 11, 12 is caused to arrive at the free layer 2 ("half-select"). In other words, only in the case that currents run in both conductive lines to create magnetic fields coupled to the free layer, is the memory cell switched ("full-select"). The possibility of using a field select method supersedes switch transistors for each one of the memory cells.

Figure 4:
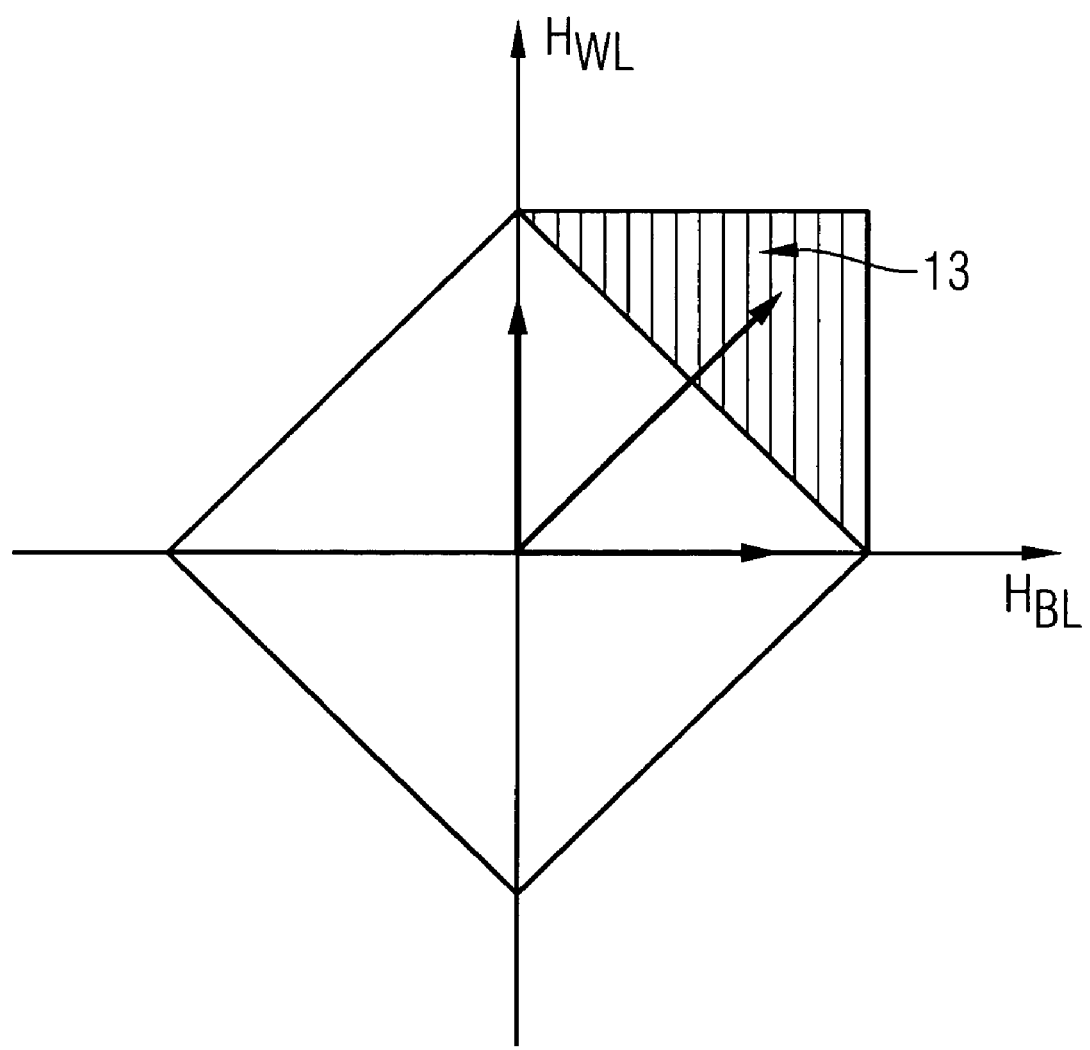
FIG. 4 is a stability diagram for switching the MRAM cell of the invention.

Reference is now made to FIG. 4, illustrating a typical stability diagram for switching the MRAM cell of the invention. In FIG. 4, first and second conductive lines are identified by bit line (BL) and word line (WL), respectively. As illustrated in FIG. 4, an operating window 13 (hatched region) for any selected memory cell may be used that is given by a (stylized) stability boundary against domain wall motion. More specifically, a domain wall is created and driven through the memory cell free layer if the magnetic field component of word- and/or bit lines along the free layer easy axis of magnetization exceeds a critical value. For the half-selected memory cells coupled to magnetic fields of bit line or word line alone magnetic field arriving at the magnetic free layer along its easy axis is under-critical. Magnetic fields from both bit and word lines have to be combined (vector sum) to yield an over-critical composite magnetic field (full-selected memory cells).

Obviously many modifications and variations of the present invention are possible in light of the above description. It is therefore to be understood, that within the scope of appended claims, the invention may be practiced otherwise than as specifically devised.

What is claimed is:

1. A magnetoresistive random access memory (MRAM) cell, comprising:

a magnetic tunnel junction including first and second magnetic regions stacked in a parallel, overlying relationship and separated by a non-magnetic tunneling barrier layer, the first magnetic region comprising a reference layer having a fixed magnetization adjacent the tunneling barrier layer, the second magnetic region comprising a free layer provided with an easy axis of magnetization and having first and second free magnetizations that are aligned with the easy axis in opposite alignment to each other and being separated by a magnetic domain wall;

wherein the magnetic domain wall is magnetically movable along the easy axis of the free layer, the free layer is magnetically coupled to magnetic fields generated by first and second currents running through first and second conductive lines crossing each other at a crossing angle, and the easy axis of the free layer is inclined under an inclination angle relative to both the first and second conductive lines.

2. The MRAM cell of claim 1, wherein the crossing angle is about 90°.

3. The MRAM cell of claim 1, wherein the inclination angle lies in a range of more than 0° to less than 90°.

4. The MRAM cell of claim 3, wherein the inclination angle is about 45°.

5. The MRAM cell of claim 1, further comprising frustrated magnetic reservoirs magnetically coupled to the free layer.

6. The MRAM cell of claim 5, wherein the frustrated magnetic reservoirs are disposed adjacent the free layer along opposing edges thereof.

7. A method of writing to an MRAM cell, comprising:

providing an MRAM cell comprising a magnetic tunnel junction (MTJ) including first and second magnetic regions stacked in a parallel, overlying relationship and separated by a non-magnetic tunneling barrier layer, the first magnetic region comprising a reference layer having a fixed magnetization adjacent the tunneling barrier layer, the second magnetic region comprising a free layer provided with an easy axis of magnetization and having first and second free magnetizations that are aligned with the easy axis in opposite alignment to each other and being separated by a magnetic domain wall, the magnetic domain wall being magnetically movable along the easy axis of the free layer, the free layer being magnetically coupled to magnetic fields generated by first and second currents running through first and second conductive lines crossing each other, wherein the easy axis of the free layer is inclined under an inclination angle relative to both the first and second conductive lines; and switching the free magnetizations between the same and opposite directions with respect to the fixed magnetization by making first and second currents to flow through both the first and second current lines, wherein the first and second currents are chosen such that a sum of their magnetic fields at the free layer exceeds a specified critical value.

* * * * *

UNITED STATES PATENT AND TRADEMARK OFFICE
CERTIFICATE OF CORRECTION

PATENT NO.         : 7,154,773 B2                                              Page 1 of 1
APPLICATION NO.    : 11/094473
DATED              : December 26, 2006
INVENTOR(S)        : Daniel Braun et al.

It is certified that error appears in the above-identified patent and that said Letters Patent is hereby corrected as shown below:

Title Page, Item (73) should read:

Infineon Technologies AG, Munich (DE) and Altis Semiconductor, Corbeil Essonnes Cedex (FR)

Signed and Sealed this

Eighth Day of July, 2008

JON W. DUDAS
*Director of the United States Patent and Trademark Office*